(12) United States Patent
Yoshida (10) Patent No.: US 9,503,110 B2
(45) Date of Patent: Nov. 22, 2016

(54) GAS CELL, QUANTUM INTERFERENCE DEVICE, ATOMIC OSCILLATOR, ELECTRONIC DEVICE, AND MOVING OBJECT

(71) Applicant: Seiko Epson Corporation, Tokyo (JP)

(72) Inventor: Hiroyuki Yoshida, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/571,747

(22) Filed: Dec. 16, 2014

(65) Prior Publication Data

US 2015/0180487 A1    Jun. 25, 2015

(30) Foreign Application Priority Data

Dec. 20, 2013 (JP) ................. 2013-264662

(51) Int. Cl.
*H03L 7/26* (2006.01)
(52) U.S. Cl.
CPC ....................... *H03L 7/26* (2013.01)
(58) Field of Classification Search
USPC ....................................... 331/94.1
See application file for complete search history.

(56) References Cited

U.S. PATENT DOCUMENTS

| 6,320,472 | B1 | 11/2001 | Vanier | |
|---|---|---|---|---|
| 2005/0212607 | A1* | 9/2005 | Happer et al. | 331/94.1 |
| 2015/0109061 | A1* | 4/2015 | Kriz et al. | 331/94.1 |

FOREIGN PATENT DOCUMENTS

JP    2010-245805 A    10/2010

* cited by examiner

*Primary Examiner* — Joseph Chang
(74) *Attorney, Agent, or Firm* — Harness, Dickey & Pierce, P.L.C.

(57) ABSTRACT

A gas cell includes an internal space in which metal atoms and a buffer gas are sealed, the buffer gas includes nitrogen gas, and the partial pressure of the nitrogen gas in the internal space is equal to or higher than 30 Torr. The gas cell includes a pair of window portions and a body portion, the length of the internal space along a direction in which the pair of window portions are arranged is equal to or less than 10 mm, and the width of the internal space along a direction perpendicular to the direction in which the pair of window portions are arranged is equal to or less than 10 mm.

12 Claims, 8 Drawing Sheets

GAS CELL, QUANTUM INTERFERENCE DEVICE, ATOMIC OSCILLATOR, ELECTRONIC DEVICE, AND MOVING OBJECT

BACKGROUND

1. Technical Field

The present invention relates to a gas cell, a quantum interference device, an atomic oscillator, an electronic device, and a moving object.

2. Related Art

As an oscillator having excellent long-term frequency stability, an atomic oscillator which oscillates on the basis of energy transition of atoms of an alkali metal such as rubidium or cesium is known.

In general, an operation principle of the atomic oscillator is mainly classified into a method that uses a double resonance phenomenon of light and microwaves and a method that uses a quantum interference effect (coherent population trapping (CPT)) of two types of light having different frequencies.

Even in any method of the atomic oscillator, typically, the alkali metal is sealed in a gas cell along with a buffer gas (for example, see JP-A-2010-245805).

Recently, due to the demand for a reduction in size of the atomic oscillator, a reduction in size of the gas cell is required. In a small gas cell, the pressure of the buffer gas needs to be increased for the purpose of enhancing short-term frequency stability.

However, in a case where the pressure of the buffer gas is increased (for example, 30 Torr or higher), when neon is used as the buffer gas, there is a problem in that long-term frequency stability is degraded. It is inferred that this problem occurs because neon has a tendency to easily diffuse toward the inner wall of the gas cell and the tendency becomes significant when the pressure in the gas cell is increased.

SUMMARY

An advantage of some aspects of the invention is that it provides a gas cell, a quantum interference device, and an atomic oscillator capable of realizing excellent frequency stability even in a case where the gas cell is reduced in size, and provides an electronic device and a moving object having the gas cell and excellent reliability.

The invention can be implemented as the following forms or application examples.

APPLICATION EXAMPLE 1

This application example is directed to a gas cell including: metal atoms which are sealed in an internal space; and a buffer gas which is sealed in the internal space and includes nitrogen gas, in which a partial pressure of the nitrogen gas in the internal space is equal to or higher than 30 Torr.

According to the gas cell, the nitrogen gas is less likely to diffuse toward the wall surface of the internal space of the gas cell, and thus the pressure of the buffer gas in the internal space can be stabilized over a long period of time. Therefore, excellent long-term frequency stability can be realized. Particularly, since the partial pressure of the nitrogen gas is 30 Torr or higher, the long-term frequency stability is enhanced compared to a case of using neon gas as the buffer gas, and thus the effect becomes significant.

In addition, since the partial pressure of the nitrogen gas is a high pressure of 30 Torr or higher, even when the gas cell is reduced in size, the action of the buffer gas in the gas cell is appropriately exhibited, and thus excellent short-term frequency stability can be realized.

APPLICATION EXAMPLE 2

In the gas cell according to the application example, it is preferable that the buffer gas further includes argon gas.

The argon gas has temperature characteristics opposite to the nitrogen gas. Accordingly, when the buffer gas includes the nitrogen gas and the argon gas, the temperature characteristics thereof can cancel each other out. Therefore, excellent temperature characteristics can be realized (a change in frequency with temperature is reduced).

APPLICATION EXAMPLE 3

In the gas cell according to the application example, it is preferable that the buffer gas further includes krypton gas.

The krypton gas has temperature characteristics opposite to the nitrogen gas. Accordingly, when the buffer gas includes the nitrogen gas and the krypton gas, the temperature characteristics thereof can cancel each other out. Therefore, excellent temperature characteristics can be realized (a change in frequency with temperature is reduced).

APPLICATION EXAMPLE 4

In the gas cell according to the application example, it is preferable that the metal atoms are cesium atoms.

With this configuration, the gas cell which can be used in a quantum interference device in a method that uses a double resonance phenomenon or a method that uses a quantum interference effect can be relatively easily realized.

APPLICATION EXAMPLE 5

In the gas cell according to the application example, it is preferable that the metal atoms are rubidium atoms.

With this configuration, the gas cell which can be used in a quantum interference device in a method that uses a double resonance phenomenon or a method that uses a quantum interference effect can be relatively easily realized.

APPLICATION EXAMPLE 6

It is preferable that the gas cell according to the application example further includes: a pair of window portions; and a body portion which is disposed between the pair of window portions and forms the internal space along with the pair of window portions, in which a distance between the pair of window portions is equal to or less than 10 mm.

With this configuration, the small gas cell can be provided. In addition, in the small gas cell, the partial pressure of the buffer gas needs to be increased in order to exhibit excellent characteristics. Therefore, by applying the invention to the small gas cell, the above-described effects become significant.

APPLICATION EXAMPLE 7

In the gas cell according to the application example, it is preferable that a width of the body portion along a direction perpendicular to a direction in which the pair of window portions are arranged is equal to or less than 10 mm.

With this configuration, the small gas cell can be provided. In addition, in the small gas cell, the partial pressure of the buffer gas needs to be increased in order to exhibit excellent characteristics. Therefore, by applying the invention to the small gas cell, the above-described effects become significant.

APPLICATION EXAMPLE 8

In the gas cell according to the application example, it is preferable that the buffer gas does not substantially include neon gas.

With this configuration, the partial pressure of the buffer gas can be stabilized over a long period of time.

APPLICATION EXAMPLE 9

This application example is directed to a quantum interference device including: the gas cell according to the application example.

With this configuration, even when the gas cell is reduced in size, excellent frequency stability can be realized.

APPLICATION EXAMPLE 10

This application example is directed to an atomic oscillator including: the gas cell according to the application example.

With this configuration, even when the gas cell is reduced in size, excellent frequency stability can be realized.

APPLICATION EXAMPLE 11

This application example is directed to an electronic device including: the gas cell according to the application example.

With this configuration, the electronic device having excellent reliability can be provided.

APPLICATION EXAMPLE 12

This application example is directed to a moving object including: the gas cell according to the application example.

With this configuration, the moving object having excellent reliability can be provided.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a gas cell, a quantum interference device, an atomic oscillator, an electronic device, and a moving object according to the invention will be described in detail on the basis of an embodiment illustrated in the accompanying drawings.

1. Atomic Oscillator (Quantum Interference Device)

First, the atomic oscillator (the atomic oscillator including the quantum interference device according to the invention) according to the invention will be described. In addition, hereinafter, an example in which the quantum interference device according to the invention is applied to the atomic oscillator will be described. However, the quantum interference device according to the invention is not limited thereto, and for example, may also be applied to a magnetic sensor, a quantum memory, and the like in addition to the atomic oscillator.

Figure 1:
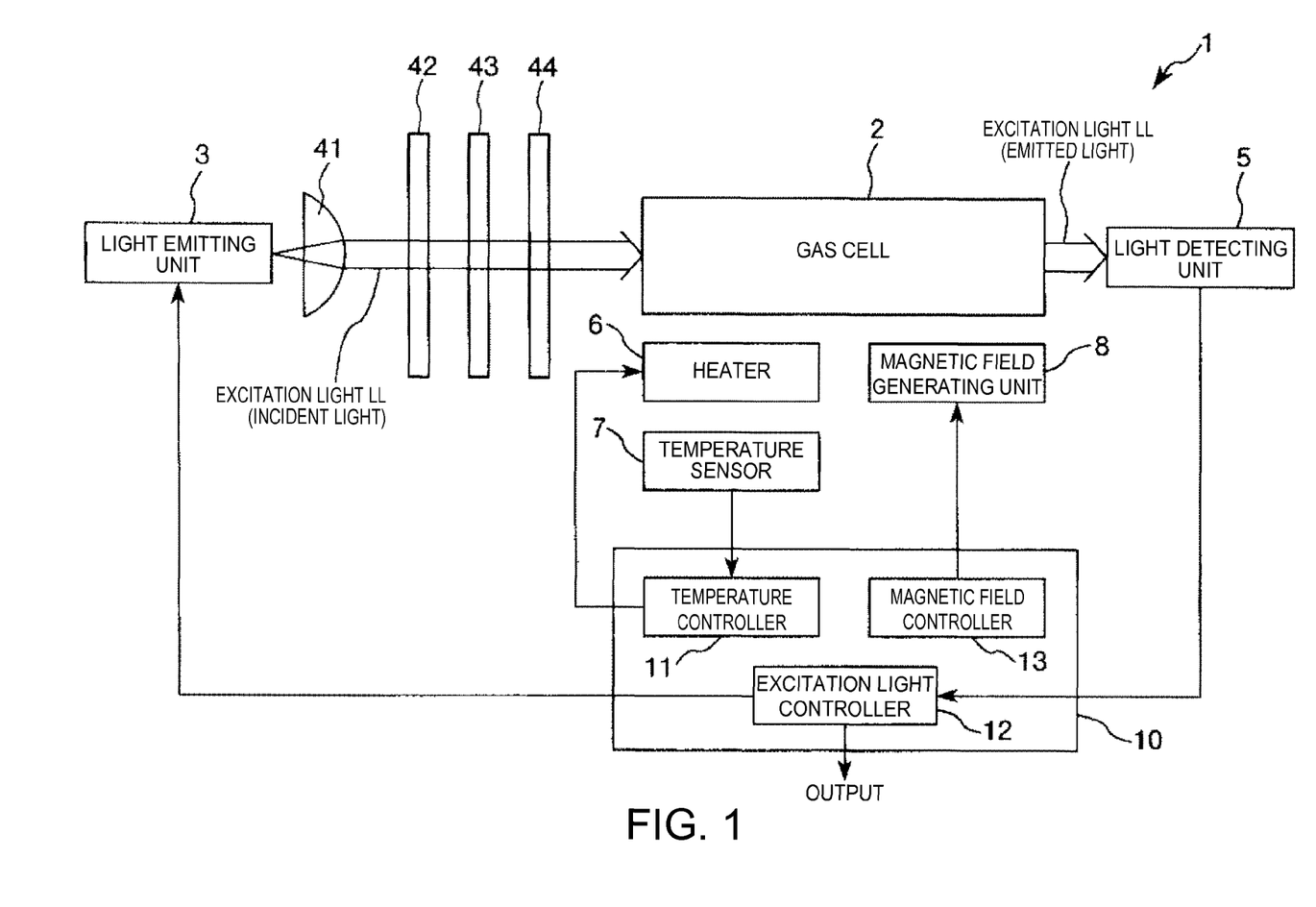
FIG. 1 is a schematic view illustrating an atomic oscillator (quantum interference device) according to an embodiment of the invention.
Figure 2:
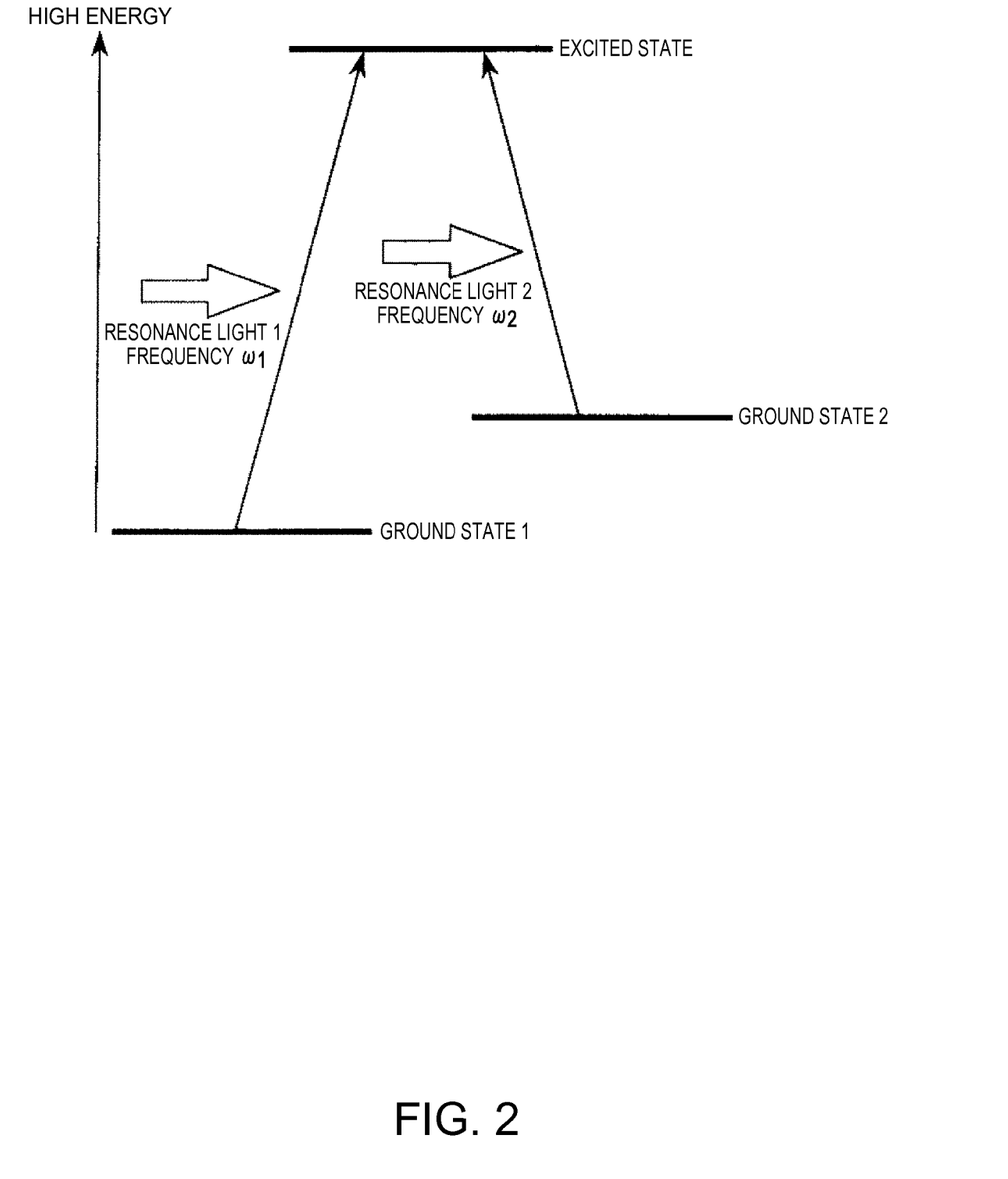
FIG. 2 is a view illustrating an energy state of an alkali metal.
Figure 3:
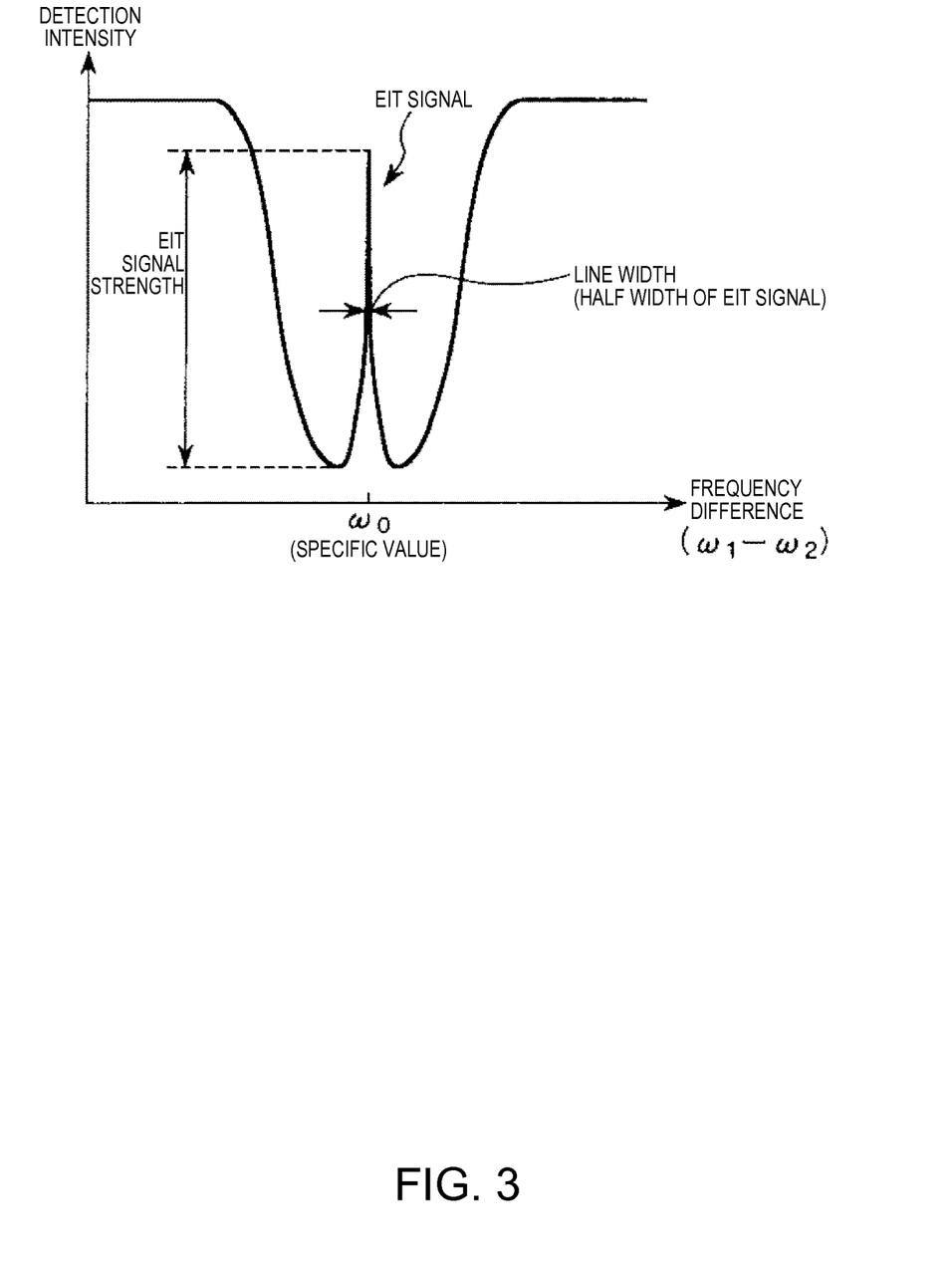
FIG. 3 is a graph showing the relationship between a difference in frequency between two lights emitted by a light emitting unit and the intensity of light detected by a light detecting unit.

FIG. 1 is a schematic view illustrating the atomic oscillator (quantum interference device) according to the embodiment of the invention. FIG. 2 is a view illustrating an energy state of an alkali metal. FIG. 3 is a graph showing the relationship between a difference in frequency between two lights emitted by a light emitting unit and the intensity of light detected by a light detecting unit.

An atomic oscillator 1 illustrated in FIG. 1 is an atomic oscillator that uses a quantum interference effect.

As illustrated in FIG. 1, the atomic oscillator 1 includes a gas cell 2 (gas cell), a light emitting unit 3, optical components 41, 42, 43, and 44, a light detecting unit 5, a heater 6, a temperature sensor 7, a magnetic field generating unit 8, and a controller 10.

First, the principle of the atomic oscillator 1 is simply described.

As illustrated in FIG. 1, in the atomic oscillator 1, the light emitting unit 3 emits an excitation light LL toward the gas cell 2, and the excitation light LL transmitted by the gas cell 2 is detected by the light detecting unit 5.

An alkali metal (metal atoms) in a gas phase is sealed in the gas cell 2, and as illustrated in FIG. 2, the alkali metal has three-level system energy levels and thus can be in three states, which are two ground states (ground states 1 and 2) having different energy levels and an excited state. Here, the ground state 1 is an energy state lower than the ground state 2.

The excitation light LL emitted by the light emitting unit 3 includes two types of resonance lights 1 and 2 having different frequencies. When the two types of resonance lights 1 and 2 irradiate the alkali metal in the gas phase as described above, the light absorptance (light transmittance) of the resonance lights 1 and 2 through the alkali metal is changed according to the difference ($\omega_1 - \omega_2$) between a frequency $\omega_1$ of the resonance light 1 and a frequency $\omega_2$ of the resonance light 2.

In addition, when the difference ($\omega_1 - \omega_2$) between the frequency $\omega_1$ of the resonance light 1 and the frequency $\omega_2$ of the resonance light 2 matches a frequency corresponding the energy difference between the ground state 1 and the ground state 2, excitations from the ground state 1 and the ground state 2 to the excited state are stopped. At this time, both the resonance lights 1 and 2 are not absorbed by the alkali metal but pass therethrough. This phenomenon is called a CPT phenomenon or an electromagnetically induced transparency (EIT) phenomenon.

For example, when the light emitting unit 3 fixes the frequency $\omega_1$ of the resonance light 1 and changes the frequency $\omega_2$ of the resonance light 2, in a case where the difference ($\omega_1-\omega_2$) between the frequency $\omega_1$ of the resonance light 1 and the frequency $\omega_2$ of the resonance light 2 matches a frequency $\omega_0$ corresponding to the energy difference between the ground state 1 and the ground state 2, the detection intensity of the light detecting unit 5 is steeply increased as illustrated in FIG. 3. This steep signal is detected as an EIT signal. The EIT signal has an inherent value determined by the type of alkali metal. Therefore, the oscillator can be configured by using the EIT signal.

Hereinafter, each unit of the atomic oscillator 1 will be sequentially described.

Gas Cell

The alkali metal in the gas phase such as rubidium, cesium, or sodium is sealed in the gas cell 2. In addition, a buffer gas is sealed in the gas cell 2 along with the alkali metal gas.

Particularly, the gas cell 2 uses high-pressure nitrogen gas as the buffer gas. Therefore, the atomic oscillator 1 realizes excellent frequency stability while achieving a reduction in the size of the gas cell 2. The details of the gas cell 2 will be described later.

Light Emitting Unit

The light emitting unit 3 (light source) has a function of emitting the excitation light LL which excites alkali metal atoms in the gas cell 2.

More specifically, the light emitting unit 3 emits the two types of lights (the resonance light 1 and resonance light 2) having different frequencies described above as the excitation light LL.

The resonance light 1 can excite (resonate) the alkali metal in the gas cell 2 from the above-mentioned ground state 1 to the excited state. The resonance light 2 can excite (resonate) the alkali metal in the gas cell 2 from the ground state 2 to the excited state.

The light emitting unit 3 is not particularly limited as long as it can emit excitation light as described above, and for example, a semiconductor laser such as a vertical-cavity surface-emitting laser (VCSEL) or the like may be used.

The light emitting unit 3 is adjusted to have a predetermined temperature (for example, about 40° C.) by a temperature adjustment element (heating resistor, Peltier element, and the like), which is not illustrated.

Optical Components

The plurality of optical components 41, 42, 43, and 44 are provided on a light path of the excitation light LL between the light emitting unit 3 and the gas cell 2 described above.

Here, the optical component 41, the optical component 42, the optical component 43, and the optical component 44 are provided in this order from the light emitting unit 3 side to the gas cell 2 side.

The optical component 41 is a lens. Accordingly, the excitation light LL can irradiate the gas cell 2 without waste.

In addition, the optical component 41 has a function of transforming the excitation light LL into a parallel light. Accordingly, the excitation light LL can be simply and reliably prevented from being reflected from the inner wall of the gas cell 2. Therefore, the resonance of the excitation light in the gas cell 2 is appropriately generated, and as a result, oscillation characteristics of the atomic oscillator 1 can be enhanced.

The optical component 42 is a polarizing plate. Therefore, polarization of the excitation light LL from the light emitting unit 3 can be adjusted to a predetermined direction.

The optical component 43 is a neutral density filter (ND filter). Accordingly, the intensity of the excitation light LL that is incident on the gas cell 2 can be adjusted (reduced). Therefore, even in a case where the output of the light emitting unit 3 is high, the excitation light that is incident on the gas cell 2 can be set to a predetermined light amount. In this embodiment, the intensity of the excitation light LL which passes through the above-described optical component 42 and has polarization in the predetermined direction is adjusted by the optical component 43.

The optical component 44 is a quarter-wave plate. Accordingly, the excitation light LL from the light emitting unit 3 can be converted from linear polarization into circular polarization (right-handed circular polarization or left-handed circular polarization).

In a state where Zeeman splitting occurs in the alkali metal atoms in the gas cell 2 in the presence of a magnetic field of the magnetic field generating unit 8, as described later, when the linearly polarized excitation light irradiates the alkali metal atoms, due to the interaction between the excitation light and the alkali metal atoms, the alkali metal atoms are uniformly dispersed in a plurality of levels in which Zeeman splitting occurs. As a result, the number of alkali metal atoms in a desired energy level is relatively smaller than the number of alkali metal atoms in the other energy levels. Accordingly, the number of atoms that exhibit a desired EIT phenomenon is reduced, and the strength of the desired EIT signal is reduced, resulting in the degradation of the oscillation characteristics of the atomic oscillator 1.

In the state where Zeeman splitting occurs in the alkali metal atoms in the gas cell 2 in the presence of the magnetic field of the magnetic field generating unit 8, as described later, when the circularly polarized excitation light irradiates the alkali metal atoms, due to the interaction between the excitation light and the alkali metal atoms, the number of alkali metal atoms in a desired energy level among the plurality of levels in which Zeeman splitting occurs can be relatively larger than the number of alkali metal atoms in the other energy levels. Therefore, the number of atoms that exhibit the desired EIT phenomenon is increased, and the strength of the desired EIT signal is increased, resulting in the improvement in the oscillation characteristics of the atomic oscillator 1.

Light Detecting Unit

The light detecting unit 5 has a function of detecting the intensity of the excitation light LL (the resonance light 1 and resonance light 2) that passes through the inside of the gas cell 2.

The light detecting unit 5 is not particularly limited as long as it can detect the excitation light as described above, and for example, a light detector (light receiving element) such as a solar cell or a photodiode may be used.

Heater

The heater 6 (heating unit) has a function of heating the above-described gas cell 2 (more specifically, the alkali metal in the gas cell 2). Accordingly, the alkali metal in the gas cell 2 can be maintained in a gas phase at an appropriate concentration.

The heater 6 generates heat by conduction (direct current), and for example, includes a heating resistor.

In addition, the heater 6 may not come into contact with the gas cell 2 as long as it can heat the gas cell 2, and in this case, is provided to come into contact with the gas cell 2 via a member (for example, a member made of metal) having excellent thermal conductivity. Instead of the heater 6 or in addition to the heater 6, a Peltier element may be used to heat the gas cell 2.

Temperature Sensor

The temperature sensor 7 detects the temperature of the heater 6 or the gas cell 2. On the basis of the detection result of the temperature sensor 7, a heating value of the above-described heater 6 is controlled. Accordingly, the alkali metal atoms in the gas cell 2 can be maintained at a desired temperature.

The installation position of the temperature sensor 7 is not particularly limited, for example, may be on the heater 6, or may be on the outer surface of the gas cell 2.

The temperature sensor 7 is not particularly limited and various known temperature sensors such as a thermistor or a thermocouple may be used.

Magnetic Field Generating Unit

The magnetic field generating unit 8 has a function of generating a magnetic field which causes Zeeman splitting to occur in the plurality of degenerate energy levels of the alkali metal atoms in the gas cell 2. Accordingly, gaps between the different energy levels of the alkali metal atoms which are degenerate are widened by the Zeeman splitting, and thus resolution can be enhanced. As a result, the accuracy of the oscillation frequency of the atomic oscillator 1 can be increased.

The magnetic field generating unit 8 is configured by, for example, a Helmholtz coil which is disposed to interpose the gas cell 2 therein, or is configured by a solenoid coil which is disposed to cover the gas cell 2. Accordingly, a uniform magnetic field in a single direction can be generated in the gas cell 2.

The magnetic field generated by the magnetic field generating unit 8 is a constant magnetic field (direct current magnetic field), and an alternating current magnetic field may also be superposed thereon.

Controller

The controller 10 has a function of controlling the light emitting unit 3, the heater 6, and the magnetic field generating unit 8.

The controller 10 includes an excitation light controller 12 which controls the frequencies of the resonance lights 1 and 2 of the light emitting unit 3, a temperature controller 11 which controls the temperature of the alkali metal in the gas cell 2, and a magnetic field controller 13 which controls the magnetic field from the magnetic field generating unit 8.

The excitation light controller 12 controls the frequencies of the resonance lights 1 and 2 emitted by the light emitting unit 3 on the basis of the detection result of the light detecting unit 5 described above. More specifically, the excitation light controller 12 controls the frequencies of the resonance lights 1 and 2 emitted by the light emitting unit 3 so that the $(\omega_1-\omega_2)$ described above becomes a natural frequency $\omega_0$ of the alkali metal described above.

In addition, although not illustrated in the figure, the excitation light controller 12 includes a voltage controlled crystal oscillator (oscillation circuit), and outputs an oscillation frequency of the voltage controlled crystal oscillator as an output signal of the atomic oscillator 1 while performing synchronization and adjustment thereon on the basis of the detection result of the light detecting unit 5.

In addition, the temperature controller 11 controls conduction to the heater 6 on the basis of the detection result of the temperature sensor 7. Accordingly, the gas cell 2 can be maintained in a desired temperature range (for example, about 70° C.)

The magnetic field controller 13 controls conduction to the magnetic field generating unit 8 so that the magnetic field generated by the magnetic field generating unit 8 becomes constant.

The controller 10 is, for example, provided in an IC chip mounted on a substrate.

The atomic oscillator 1 configured as described above employs a method which uses the quantum interference effect, and does not need a cavity for resonating microwaves as in the atomic oscillator employing a method which uses a double resonance phenomenon. Therefore, the atomic oscillator 1 can easily achieve a reduction in size compared to the atomic oscillator which uses the double resonance phenomenon.

In order to increase short-term frequency stability, the above-described EIT signal needs to have a small line width (half width) and high strength.

However, when the gas cell 2 is reduced in size to reduce the size of the entire atomic oscillator 1, the number of alkali metal atoms which contribute to the above-described EIT phenomenon is reduced. Therefore, the strength of the EIT signal is reduced, and a signal-to-noise ratio is deteriorated. In addition, when the strength of the EIT signal is increased, the effect of the interaction between the alkali metal atoms is increased, and the line width of the EIT signal is increased. For this reason, when the gas cell 2 is simply reduced in size, excellent short-term frequency stability cannot be realized.

Here, in the atomic oscillator 1, the high-pressure buffer gas is sealed in the gas cell 2. When the pressure of the buffer gas is increased, the interaction between the alkali metal atoms can be effectively suppressed by the buffer gas. Therefore, excellent short-term frequency stability can be achieved.

Based on the premise described above, the inventors has intensively conducted examinations, and obtained the knowledge that long-term frequency stability varies depending on the pressure or type of the buffer gas. In addition, the gas cell 2 provided in the atomic oscillator 1 has a configuration based on the knowledge. Hereinafter, this point will be described.

Detailed Description of Gas Cell

Figure 4:
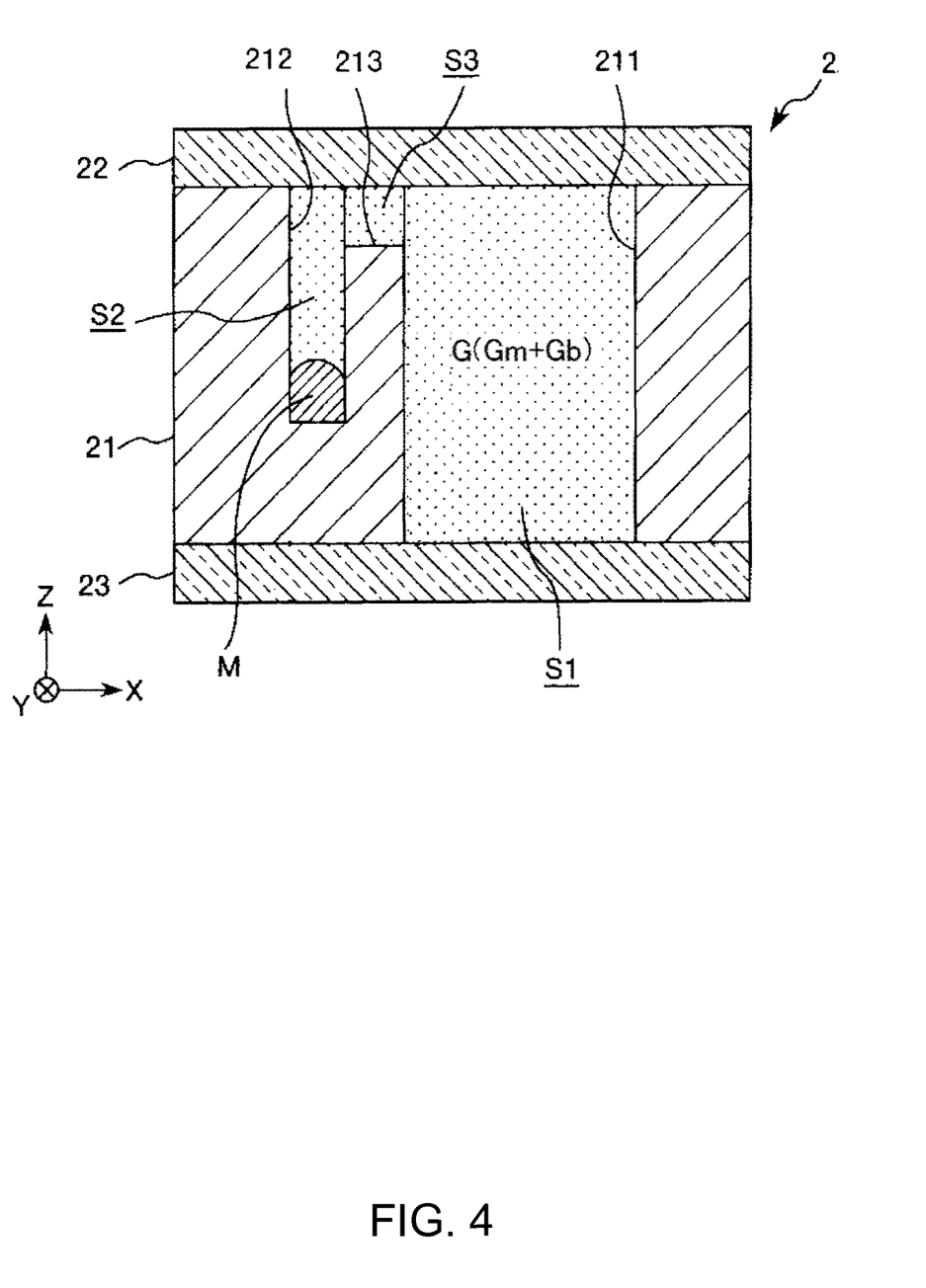
FIG. 4 is a longitudinal cross-sectional view of a gas cell provided in the atomic oscillator illustrated in FIG. 1.
Figure 5:
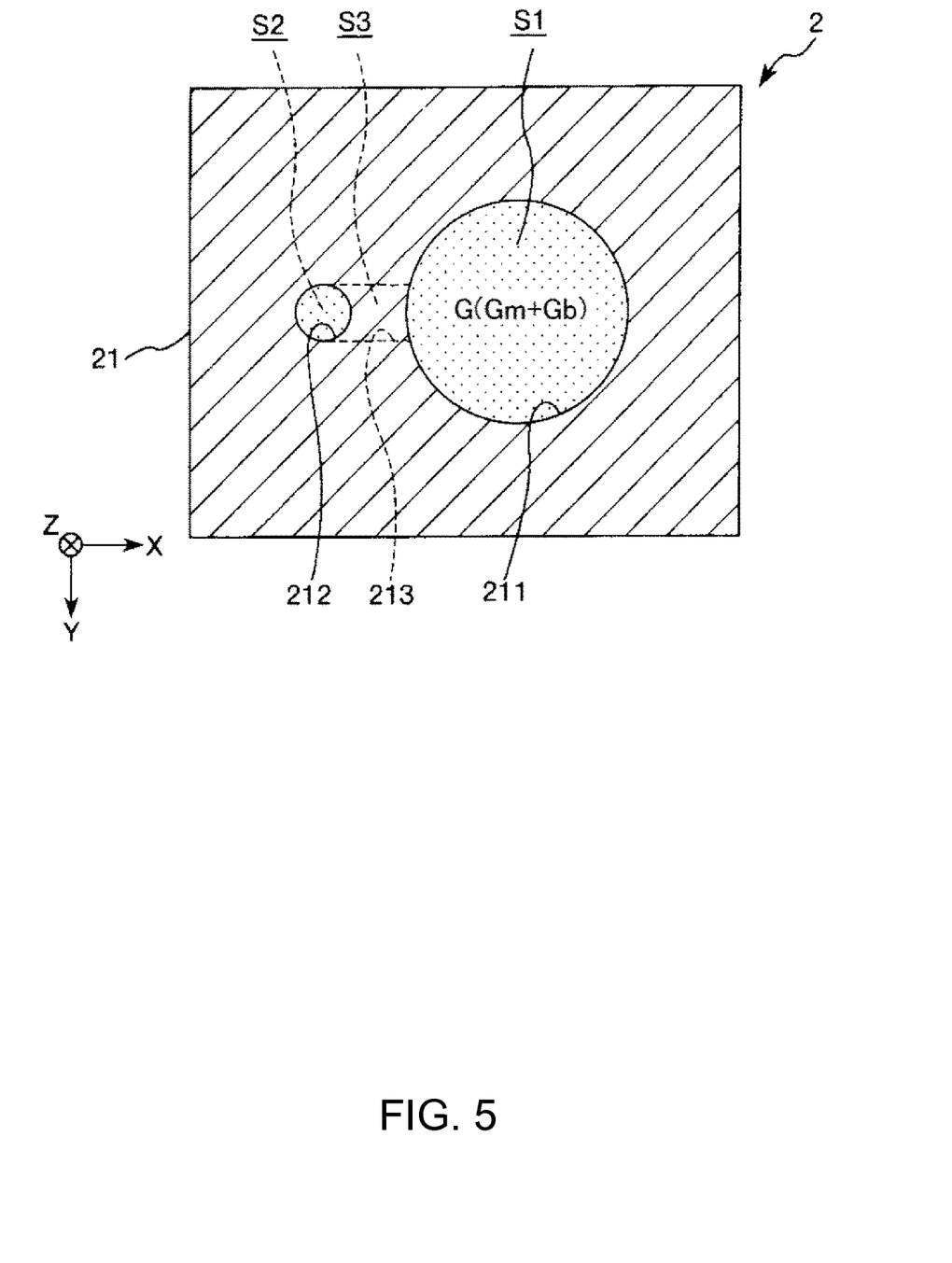
FIG. 5 is a transverse cross-sectional view of the gas cell illustrated in FIG. 4.
Figure 6:
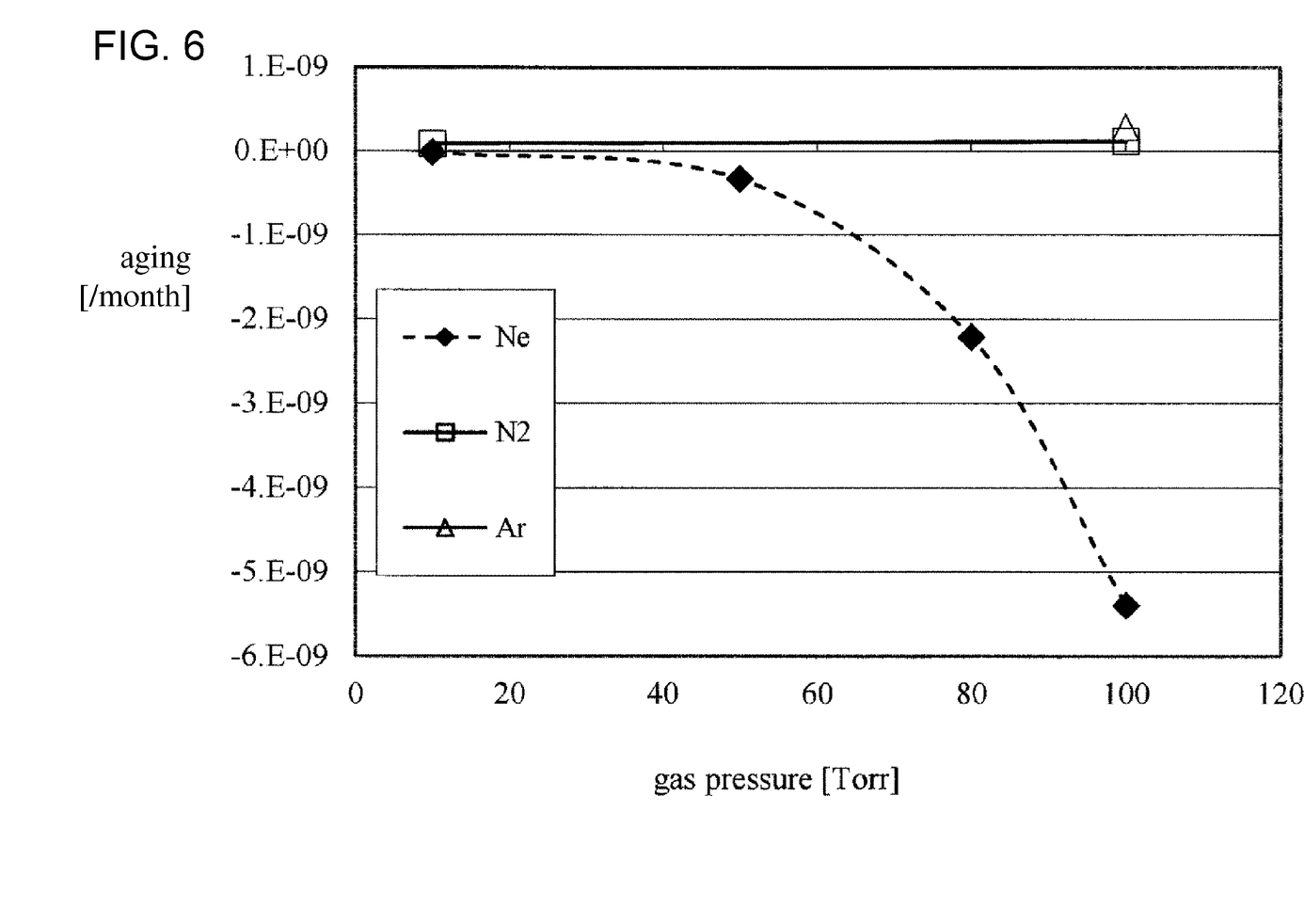
FIG. 6 is a graph showing the relationship between the partial pressure of a buffer gas and long-term frequency stability for each type (neon, nitrogen, and argon) of the buffer gas.

FIG. 4 is a longitudinal cross-sectional view of the gas cell provided in the atomic oscillator illustrated in FIG. 1, and FIG. 5 is a transverse cross-sectional view of the gas cell illustrated in FIG. 4. FIG. 6 is a graph showing the relationship between the partial pressure of the buffer gas and the long-term frequency stability for each type (neon, nitrogen, or argon) of the buffer gas.

In FIG. 4 and FIG. 5, for convenience of description, the X axis, the Y axis, and the Z axis are illustrated as three axes which are perpendicular to each other, the tip end side of each illustrated arrow is referred to as "+ (positive)", and the base end side thereof is referred to as "− (negative)". Hereinafter, for convenience of description, a direction parallel to the X axis is referred to as an "X-axis direction", a direction parallel to the Y axis is referred to as a "Y-axis direction", and a direction parallel to the Z axis is referred to as a "Z-axis direction".

First, a portion of the gas cell 2 which is a container in which the alkali metal and the buffer gas are sealed will be described.

As illustrated in FIGS. 4 and 5, the gas cell 2 includes a body portion 21 and a pair of window portions 22 and 23 which are provided with the body portion 21 interposed therebetween.

In the body portion 21, a columnar through-hole 211 that penetrates through the body portion 21 in the Z-axis direction, a recessed portion 212 which is open to the +Z axis direction side, and a groove 213 which is open to the +Z axis direction side and allows the through-hole 211 and the recessed portion 212 to communicate with each other are formed.

The window portion 22 is bonded to the end surface of the body portion 21 on the +Z axis direction side, and the window portion 23 is bonded to the end surface of the body portion 21 on the −Z axis direction side. Accordingly, a space S1 is formed by the through-hole 211, a space S2 is formed by the recessed portion 212, and a space S3 is formed by the groove 213. That is, the gas cell 2 includes the spaces S1, S2, and S3 which communicate with each other, and the spaces S1 and S2 communicate with each other via the space S3.

An alkali metal Gm in a gas phase and a buffer gas Gb are sealed in the spaces S1, S2, and S3. In addition, an alkali metal M in a liquid or solid phase is accommodated in the space S2.

The alkali metal Gm in the gas phase accommodated in the space S1 is excited by the excitation light LL.

The temperature of the space S2 is adjusted to be lower than the space S1. Accordingly, the extra alkali metal Gm can be stored as the alkali metal M in the liquid or solid phase in the space S2. In addition, the alkali metal in the liquid or solid phase can be prevented from being precipitated (condensed) in the space S1.

Since the space S2 communicates with the space S1 via the space S3, in a case where the alkali metal Gm in the gas phase in the space S1 is reduced by reaction with the inner wall surface of the gas cell 2 or the like, the alkali metal M in the space S2 is vaporized, and thus the concentration of the alkali metal Gm in the gas phase in the space S1 can be maintained at a constant level.

A material which forms the window portions 22 and 23 of the gas cell 2 is not particularly limited as long as it has a property of transmitting the excitation light described above, and for example, a glass material, crystal, or the like may be used. Depending on the thicknesses of the window portions 22 and 23 or the intensity of the excitation light, the window portions 22 and 23 may be made of silicon.

On the other hand, a material which forms the body portion 21 of the gas cell 2 is not particularly limited and similarly to the window portions 22 and 23, may be a glass material, crystal, or the like, and may also be a metal material, a resin material, a silicon material, or the like. Among these, as a constituent material of the body portion 21, any of a glass material, crystal, and a silicon material is preferably used, and a silicon material is more preferably used. Accordingly, even in a case of forming small gas cells 2 which are equal to or less than 10 mm in width or height, highly accurate body portions 21 can be easily formed by using a microfabrication technique such as etching. In addition, the body portion 21 made of the silicon material can be simply and airtightly bonded to the window portions 22 and 23 made of the glass material by anodic bonding.

The method of bonding the body portion 21 to the window portions 22 and 23 of the gas cell 2 is determined by the constituent materials thereof, and is not particularly limited as long as the materials can be airtightly bonded to each other. For example, a bonding method using an adhesive, direct bonding, anodic bonding, and the like may be used.

As described above, in the internal space formed by the spaces S1, S2, and S3 of the gas cell 2 (hereinafter, simply referred to as an "internal space"), a gas mixture of the alkali metal Gm in the gas phase and the buffer gas Gb is sealed. Here, the spaces S2 and S3 may be omitted so that the alkali metal M in the liquid or solid phase may be precipitated in the space S1. In this case, the temperature distribution of the gas cell 2 may be managed so as not to precipitate the alkali metal M in the region through which the excitation light LL passes.

Subsequently, the alkali metal and the buffer gas will be described.

As the alkali metal sealed in the gas cell 2, as described above, for example, an alkali metal such as rubidium, cesium, or sodium may be used.

Particularly, as the alkali metal atoms, cesium atoms or rubidium atoms are preferably used. Accordingly, the gas cell 2 which can be used in the atomic oscillator 1 in the method that uses the double resonance phenomenon or the method that uses the quantum interference effect can be relatively easily realized.

As the buffer gas sealed in the gas cell 2, for example, helium, neon, nitrogen, argon, krypton, or the like may be used. Here, in a case of using cesium atoms or rubidium atoms as the alkali metal atoms, when helium, neon, or nitrogen is singly used as the buffer gas, positive temperature characteristics in which frequency increases as temperature increases are exhibited in a case where the other temperature characteristics of the atomic oscillator 1 are ignored. In a case of singly using argon or krypton as the buffer gas, negative temperature characteristics in which frequency decreases as temperature increases are exhibited in a case where the other temperature characteristics of the atomic oscillator 1 are ignored.

In a case of using neon gas among helium, neon, and nitrogen which exhibit the positive temperature characteristics as the buffer gas, as illustrated in FIG. 6, when the partial pressure of the buffer gas increases, the long-term frequency stability decreases. Particularly, when the partial pressure of the buffer gas is 30 Torr or less, the long-term frequency stability steeply decreases. It is inferred that this is because neon has a tendency to easily diffuse toward the inner wall (glass) of the gas cell and the tendency becomes significant when the pressure in the gas cell is increased. In addition, even in a case of using helium as the buffer gas, similarly, when the partial pressure of the buffer gas increases, the long-term frequency stability decreases.

In a case of using nitrogen gas as the buffer gas, even when the partial pressure of the buffer gas increases, the long-term frequency stability is not degraded.

Here, the buffer gas used in the gas cell 2 includes nitrogen gas, and the partial pressure of the nitrogen gas is 30 Torr or higher.

The nitrogen gas is less likely to diffuse toward the wall surface (glass) of the internal space of the gas cell 2, and thus the pressure of the buffer gas in the internal space of the gas cell 2 can be stabilized over a long period of time. Therefore, excellent long-term frequency stability can be realized. Particularly, since the partial pressure of the nitrogen gas is 30 Torr or higher, the long-term frequency stability is enhanced compared to a case of using the neon gas as the buffer gas, and thus the effect described above becomes significant.

Since the partial pressure of the nitrogen gas is a high pressure of 30 Torr or higher, even when the gas cell 2 is reduced in size, the action of the buffer gas in the gas cell 2 is appropriately exhibited, and thus excellent short-term frequency stability can be realized.

Here, in a case where the buffer gas is a gas mixture, the "partial pressure of nitrogen gas" is a partial pressure in the gas mixture. In addition, the gas mixture of the buffer gas and the alkali metal is sealed in the gas cell 2. However, the partial pressure of the alkali metal gas is equal to the vapor pressure of the alkali metal, and is thus extremely smaller than the partial pressure of the buffer gas. Accordingly, the partial pressure of the buffer gas can approximate the pressure of the gas mixture of the buffer gas and the alkali metal gas, that is, the pressure in the gas cell. Therefore, in a case of using a high-pressure buffer gas, the partial pressure of the alkali metal gas can be ignored.

The partial pressure of the nitrogen gas may be equal to or higher than 30 Torr, is preferably equal to or higher than 30 Torr and equal to or less than 100 Torr, and is more preferably equal to or higher than 30 Torr and equal to or less than 80 Torr. Accordingly, the action of the buffer gas which suppresses the interaction between the alkali metal atoms as described above can be effectively exhibited. From the same point of view, the partial pressure of the buffer gas is preferably equal to or higher than 30 Torr and equal to or less than 100 Torr, and is more preferably equal to or higher than 30 Torr and equal to or less than 80 Torr. Here, when the partial pressure of the nitrogen gas or the buffer gas is too low, the line width of the EIT signal has a tendency to increase. Contrary to this, when the partial pressure of the nitrogen gas or the buffer gas is too high, the intensity of the EIT signal has a tendency to decrease. In addition, the gas cell 2 needs to be strengthened, and thus it is difficult to achieve a reduction in size.

From the result shown in FIG. 6, it is preferable that the buffer gas do not substantially include neon gas. Accordingly, the partial pressure of the buffer gas can be stabilized over a long period of time. Here, "neon gas is not substantially included" includes both a case where the buffer gas does not absolutely include the neon gas and a case where the buffer gas includes a very small amount of neon gas at a degree that does not affect the frequency stability.

The buffer gas may include a gas other than the nitrogen gas. In this case, it is preferable that the buffer gas further include at least one of argon gas and krypton gas.

As described above, the argon gas and the krypton gas have temperature characteristics opposite to the nitrogen gas. Accordingly, when the buffer gas includes the nitrogen gas and the argon gas, the temperature characteristics thereof can cancel each other out. Therefore, excellent temperature characteristics can be realized (a change in frequency with temperature is reduced).

Here, as illustrated in FIG. 6, in the case of using the argon gas as the buffer gas, even when the partial pressure of the buffer gas increases, the long-term frequency stability is not degraded. It is inferred that this is because argon atoms are less likely to diffuse toward the inner wall of the gas cell 2. Similarly, in the case of using the krypton gas as the buffer gas, even when the partial pressure of the buffer gas increases, the long-term frequency stability is not degraded.

In the gas cell 2 in which the buffer gas is sealed as described above, the length of the internal space along the direction (Z axis direction) in which the pair of window portions 22 and 23 are arranged is preferably equal to or less than 10 mm. Accordingly, the small gas cell 2 can be provided. In addition, in the small gas cell 2, the partial pressure of the buffer gas needs to be increased in order to exhibit excellent characteristics. Therefore, by applying the invention to the small gas cell 2, the above-described effects become significant. From the same point of view, the width of the internal space of the gas cell 2 along the direction perpendicular to the direction in which the pair of window portions 22 and 23 are arranged is preferably equal to or less than 10 mm.

2. Electronic Device

The atomic oscillator described above may be assembled into various types of electronic devices. The electronic devices have excellent reliability.

Hereinafter, an electronic device according to the invention will be described.

Figure 7:
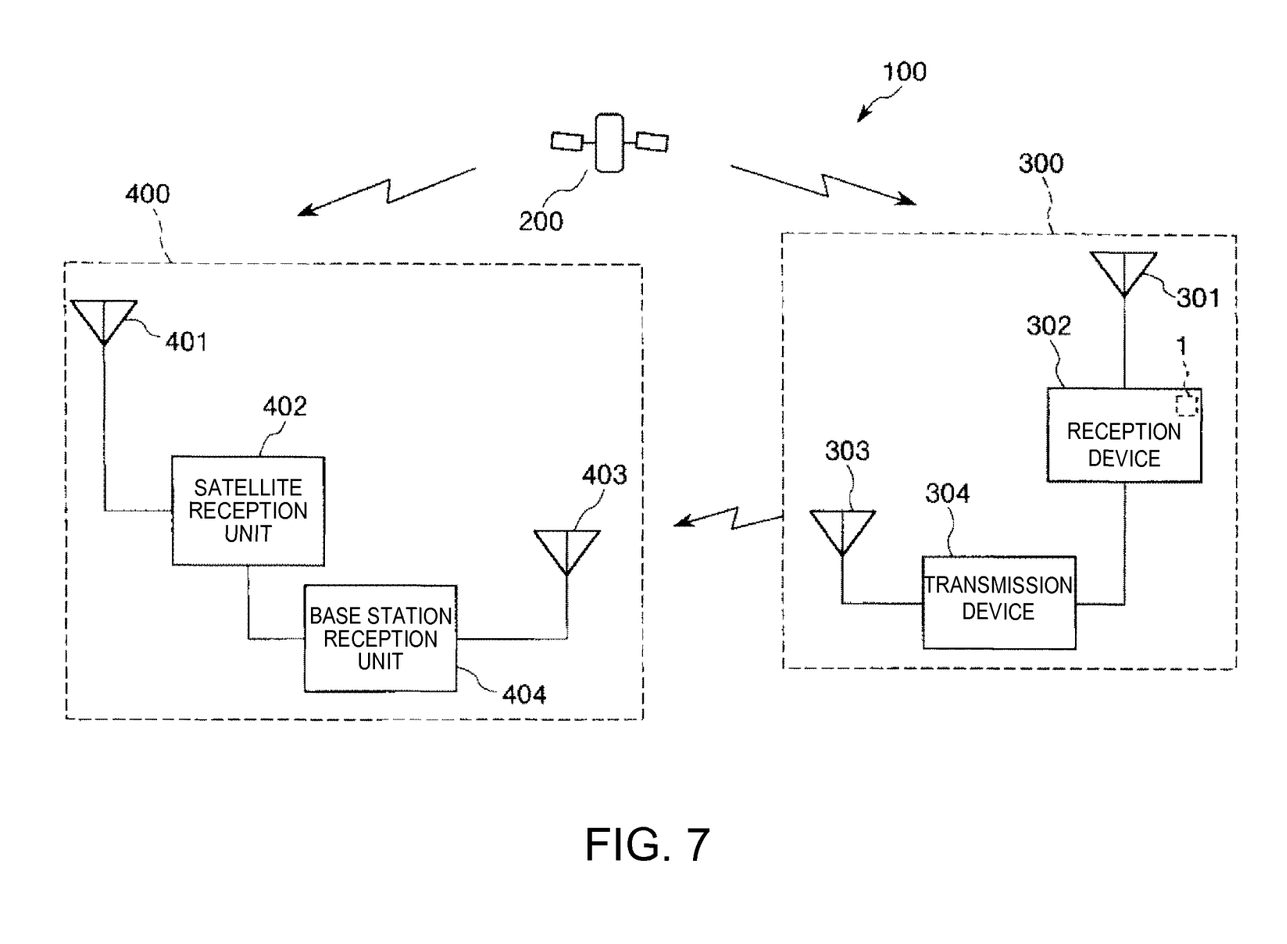
FIG. 7 is a view illustrating the schematic configuration of a case where the atomic oscillator according to the invention is used in a positioning system that uses a GPS satellite.

FIG. 7 is a view illustrating the schematic configuration of a case where the atomic oscillator according to the invention is used in a positioning system that uses a GPS satellite.

A positioning system 100 illustrated in FIG. 7 includes a GPS satellite 200, a base station device 300, and a GPS reception device 400.

The GPS satellite 200 transmits positioning information (GPS signal).

The base station device 300 includes a reception device 302 which receives the positioning information from the GPS satellite 200 at high accuracy via an antenna 301 provided in, for example, an electronic reference point (GPS connection observation station), and a transmission device 304 which transmits the positioning information received by the reception device 302 via an antenna 303.

Here, the reception device 302 is an electronic device provided with the above-described atomic oscillator 1 according to the invention as a reference frequency oscillation source. The reception device 302 has excellent reliability. In addition, the positioning information received by the reception device 302 is transmitted by the transmission device 304 in real time.

The GPS reception device 400 includes a satellite reception unit 402 which receives the positioning information from the GPS satellite 200 via an antenna 401, and a base station reception unit 404 which receives the positioning information from the base station device 300 via an antenna 403.

3. Moving Object

Figure 8:
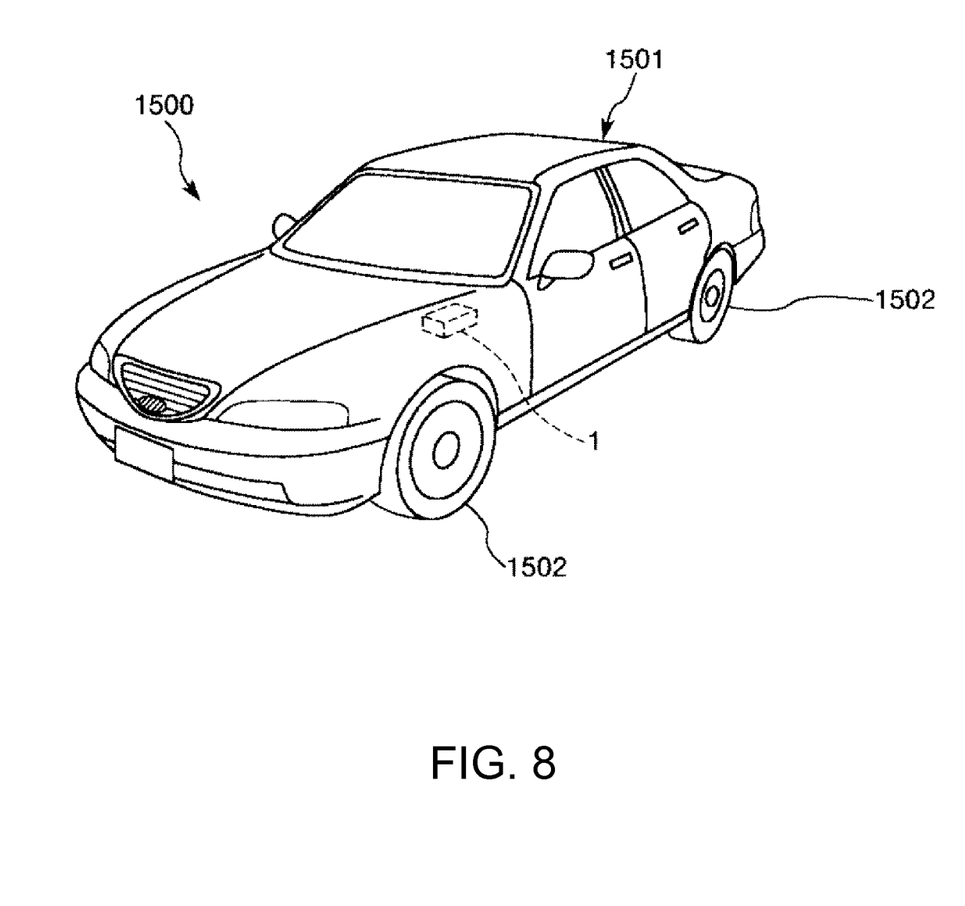
FIG. 8 is a view illustrating an example of a moving object according to the invention.

FIG. 8 is a view illustrating an example of the moving object according to the invention.

In this figure, a moving object 1500 includes a vehicle body 1501 and four wheels 1502, and is configured so that the wheels 1502 are rotated by a driving source (engine) (not illustrated) provided in the vehicle body 1501. The atomic oscillator 1 is embedded into the moving object 1500.

According to the moving object, excellent reliability can be exhibited.

The electronic device which includes the atomic oscillator according to the invention is not limited to the above description, and for example, can be applied to a cell phone, a digital still camera, an inkjet type discharge device (for example, an ink jet printer), a personal computer (mobile personal computer or laptop personal computer), a television, a video camera, a video tape recorder, a car navigation device, a pager, an electronic organizer (including a communication function), an electronic dictionary, a calculator, an electronic game equipment, a word processor, a workstation, a videophone, a security television monitor, electronic binoculars, a POS terminal, medical instruments (for example, an electronic thermometer, a blood pressure gauge, a blood sugar meter, an electrocardiogram display device, an ultrasonic diagnostic device, an electronic endoscope, and the like), a fish finder, various types of measuring apparatuses, measuring gauges (for example, measuring gauges of vehicles, airplanes, and ships), a flight simulator, terrestrial digital broadcasting, a cell phone base station, and the like.

Hereinabove, the gas cell, the quantum interference device, the atomic oscillator, the electronic device, and the moving object according to the invention have been described on the basis of the illustrated embodiment, and the invention is not limited thereto.

In addition, the configuration of each unit of the invention can be substituted with an arbitrary configuration which exhibits the same function as the above-described embodiment, or an arbitrary configuration may be added.

In addition, in the above-described embodiment, the quantum interference device which causes resonance transition of cesium or the like by using the quantum interference effect of two types of light having different frequencies is described as an example of the quantum interference device according to the invention. However, the quantum interference device according to the invention is not limited thereto, and a double resonance device which causes resonance transition of rubidium or the like by using the double resonance phenomenon of light and microwaves may also be applied.

The entire disclosure of Japanese Patent Application No. 2013-264662, filed Dec. 20, 2013 is expressly incorporated by reference herein.

What is claimed is:

1. A gas cell comprising:
   metal atoms which are sealed in an internal space; and
   a buffer gas which is sealed in the internal space and includes nitrogen gas,
   wherein a partial pressure of the nitrogen gas in the internal space is within a range of 30 Torr to 100 Torr to avoid an electromagnetically induced transparency signal decrease.
2. The gas cell according to claim 1,
   wherein the buffer gas further includes argon gas.
3. The gas cell according to claim 1,
   wherein the buffer gas further includes krypton gas.
4. The gas cell according to claim 1,
   wherein the metal atoms are cesium atoms.
5. The gas cell according to claim 1,
   wherein the metal atoms are rubidium atoms.
6. The gas cell according to claim 1, further comprising:
   a pair of window portions; and
   a body portion which is disposed between the pair of window portions and forms the internal space along with the pair of window portions,
   wherein a distance between the pair of window portions is equal to or less than 10 mm.
7. The gas cell according to claim 6,
   wherein a width of the body portion along a direction perpendicular to a direction in which the pair of window portions are arranged is equal to or less than 10 mm.
8. The gas cell according to claim 1,
   wherein the buffer gas does not substantially include neon gas.
9. A quantum interference device comprising:
   the gas cell according to claim 1.
10. An atomic oscillator comprising:
    the gas cell according to claim 1.
11. An electronic device comprising:
    the gas cell according to claim 1.
12. A moving object comprising:
    the gas cell according to claim 1.

* * * * *